(12) United States Patent
Alvarez et al.

(10) Patent No.: US 10,997,615 B1
(45) Date of Patent: May 4, 2021

(54) SYSTEM AND METHOD FOR ASSORTMENT PLANNING WITH INTERACTIVE SIMILARITY AND TRANSFERABLE DEMAND VISUALIZATION

(71) Applicant: JDA Software Group, Inc., Scottsdale, AZ (US)

(72) Inventors: Ignacio Alvarez, Montréal (CA); Gabrielle Gauthier Melancon, Montréal (CA)

(73) Assignee: Blue Yonder Group, Inc., Scottsdale, AZ (US)

( * ) Notice: Subject to any disclaimer, the term of this patent is extended or adjusted under 35 U.S.C. 154(b) by 155 days.

(21) Appl. No.: 15/802,088

(22) Filed: Nov. 2, 2017

Related U.S. Application Data

(60) Provisional application No. 62/419,037, filed on Nov. 8, 2016.

(51) Int. Cl.
| | |
|---|---|
| *G06Q 30/02* | (2012.01) |
| *G06Q 10/06* | (2012.01) |
| *G06Q 50/28* | (2012.01) |
| *G06F 17/16* | (2006.01) |
| *G06F 3/048* | (2013.01) |
| *G06F 30/00* | (2020.01) |

(52) U.S. Cl.
CPC ......... *G06Q 30/0204* (2013.01); *G06F 3/048* (2013.01); *G06F 17/16* (2013.01); *G06F 30/00* (2020.01); *G06Q 10/0637* (2013.01); *G06Q 50/28* (2013.01)

(58) Field of Classification Search
CPC ...... G06Q 10/087; G06Q 10/04; G06Q 30/02; G06Q 30/0202; G06Q 30/0201; G06Q 3/00204; G06Q 10/0637; G06Q 50/28
See application file for complete search history.

(56) References Cited

U.S. PATENT DOCUMENTS

| | | | | |
|---|---|---|---|---|
| 7,117,163 | B1* | 10/2006 | Iyer ........................ | G06Q 30/02 |
| | | | | 705/7.32 |
| 8,321,260 | B2* | 11/2012 | Bottom .................. | G06Q 10/04 |
| | | | | 705/7.29 |
| 8,527,321 | B2* | 9/2013 | Bottom .................. | G06Q 10/04 |
| | | | | 705/7.29 |
| 10,417,606 | B2* | 9/2019 | Panchamgam ...... | G06Q 10/087 |
| 2001/0047293 | A1* | 11/2001 | Waller ................. | G06Q 10/087 |
| | | | | 705/22 |
| 2002/0099678 | A1 | 7/2002 | Albright et al. | |

(Continued)

OTHER PUBLICATIONS

Kok, A. Gurhan et al., Assortment Planning: Review of Literature and Industry Practice Retail Supply Chain Management, Agrawal Publishers, Nov. 2006 (Year: 2006).*

(Continued)

*Primary Examiner* — Scott L Jarrett
(74) *Attorney, Agent, or Firm* — Spencer Fane LLP; Steven J. Laureanti

(57) ABSTRACT

A system and method are disclosed for interactive product assortment planning and visualization by receiving product attribute values for items of a product assortment is disclosed. Embodiments include displaying icons on an interactive visualization, connecting the icons with transferable demand links, identifying items to be removed from a product assortment, and transporting items among one or more supply chain entities.

20 Claims, 9 Drawing Sheets

(56) References Cited

U.S. PATENT DOCUMENTS

| | | | |
|---|---|---|---|
| 2003/0182176 A1* | 9/2003 | Monnerjahn | G06Q 10/04 705/7.29 |
| 2005/0234762 A1* | 10/2005 | Pinto | G06Q 30/02 700/44 |
| 2006/0075335 A1 | 4/2006 | Gloor | |
| 2007/0094066 A1* | 4/2007 | Kumar | G06Q 10/04 706/61 |
| 2007/0118439 A1* | 5/2007 | Kumar | G06Q 30/02 705/26.1 |
| 2007/0239753 A1* | 10/2007 | Leonard | G06Q 30/02 |
| 2009/0089273 A1* | 4/2009 | Hicks | G06F 16/00 |
| 2009/0271245 A1* | 10/2009 | Joshi | G06Q 30/02 705/7.31 |
| 2011/0238459 A1* | 9/2011 | Bottom | G06Q 10/04 705/7.29 |
| 2011/0276364 A1* | 11/2011 | Bergstrom | G06Q 10/04 705/7.29 |
| 2014/0046895 A1* | 2/2014 | Sowani | G06Q 30/0201 706/52 |
| 2014/0058781 A1* | 2/2014 | Padmanabhan | G06Q 10/06312 705/7.22 |
| 2014/0358633 A1* | 12/2014 | Wu | G06Q 30/0202 705/7.31 |
| 2015/0127419 A1* | 5/2015 | Tiwari | G06F 16/24578 705/7.29 |
| 2016/0210640 A1* | 7/2016 | Wu | G06Q 10/087 |
| 2017/0132644 A1* | 5/2017 | Boese | G06Q 30/0202 |
| 2017/0178149 A1* | 6/2017 | Morimura | G06Q 30/0201 |

OTHER PUBLICATIONS

Oracle Retail Assortment Planning—Implementation Guide Release 14.1 Oracle, Dec. 2014 (Year: 2014).*

Category Management—Assortment Optimization JDA Software Group Inc., 2015 (Year: 2015).*

Powerful New Capabilities within JDA Category Management Simplify Assortment Management Across Diverse Stores JDA Software Group Inc., Dec. 8, 2015 (Year: 2015).*

Oracle Retail Planning & Supply Chain User Group Meetings Oracle, Sep. 2015 (Year: 2015).*

The Theory and Practice of Optimizing Assortment and Space Category Management Association, Nov. 2013 (Year: 2013).*

* cited by examiner

| | 0 | 1 | 2 | 3 | 4 | 5 | 6 | 7 | 8 | 9 |
|---|---|---|---|---|---|---|---|---|---|---|
| 0 | 100% | 76% | 50% | 46% | 72% | 23% | 64% | 41% | 34% | 47% |
| 1 | 76% | 100% | 41% | 53% | 30% | 48% | 72% | 41% | 51% | 67% |
| 2 | 50% | 41% | 100% | 51% | 61% | 23% | 74% | 34% | 37% | 71% |
| 3 | 46% | 53% | 51% | 100% | 32% | 42% | 77% | 71% | 42% | 53% |
| 4 | 72% | 30% | 61% | 32% | 100% | 24% | 45% | 41% | 53% | 23% |
| 5 | 23% | 48% | 23% | 42% | 24% | 100% | 16% | 51% | 69% | 40% |
| 6 | 64% | 72% | 74% | 77% | 45% | 16% | 100% | 48% | 32% | 68% |
| 7 | 41% | 41% | 34% | 71% | 41% | 51% | 48% | 100% | 41% | 44% |
| 8 | 34% | 51% | 37% | 42% | 53% | 69% | 32% | 41% | 100% | 42% |
| 9 | 47% | 67% | 71% | 53% | 23% | 40% | 68% | 44% | 42% | 100% |

SYSTEM AND METHOD FOR ASSORTMENT PLANNING WITH INTERACTIVE SIMILARITY AND TRANSFERABLE DEMAND VISUALIZATION

CROSS-REFERENCE TO RELATED APPLICATIONS

The present disclosure is related to that disclosed in the U.S. Provisional Application No. 62/419,037, filed Nov. 8, 2016, entitled "System and Method for Similarity and Transferable Demand Interactive Visualization." U.S. Provisional Application No. 62/419,037 is assigned to the assignee of the present application. The subject matter disclosed in U.S. Provisional Application No. 62/419,037 is hereby incorporated by reference into the present disclosure as if fully set forth herein. The present invention hereby claims priority under 35 U.S.C. § 119(e) to U.S. Provisional Application No. 62/419,037.

TECHNICAL FIELD

The present disclosure relates generally to assortment planning and specifically to a system and method for visualization for product similarity and transferable demand of product assortments.

BACKGROUND

Determining whether to add or remove items from a product assortment is aided by a transferable demand analysis. A transferable demand analysis predicts how much demand transfers between products in assortments. The assortment planner may then calculate, using the transferable demand, whether sales will increase or decrease when an item is added to or removed from an assortment. Using this, and other criteria, the assortment planner may determine what products should be included in new product assortments. The process to analyze demand transferability, however, is generally difficult since one needs to easily visualize the similarity that exists between products in the assortments, which is not provided by existing solutions. The inability to easily visualize and analyze product similarity and demand transferability for product assortments is undesirable.

BRIEF DESCRIPTION OF THE DRAWINGS

A more complete understanding of the present invention may be derived by referring to the detailed description when considered in connection with the following illustrative figures. In the figures, like reference numbers refer to like elements or acts throughout the figures.

DETAILED DESCRIPTION

Figure 1:
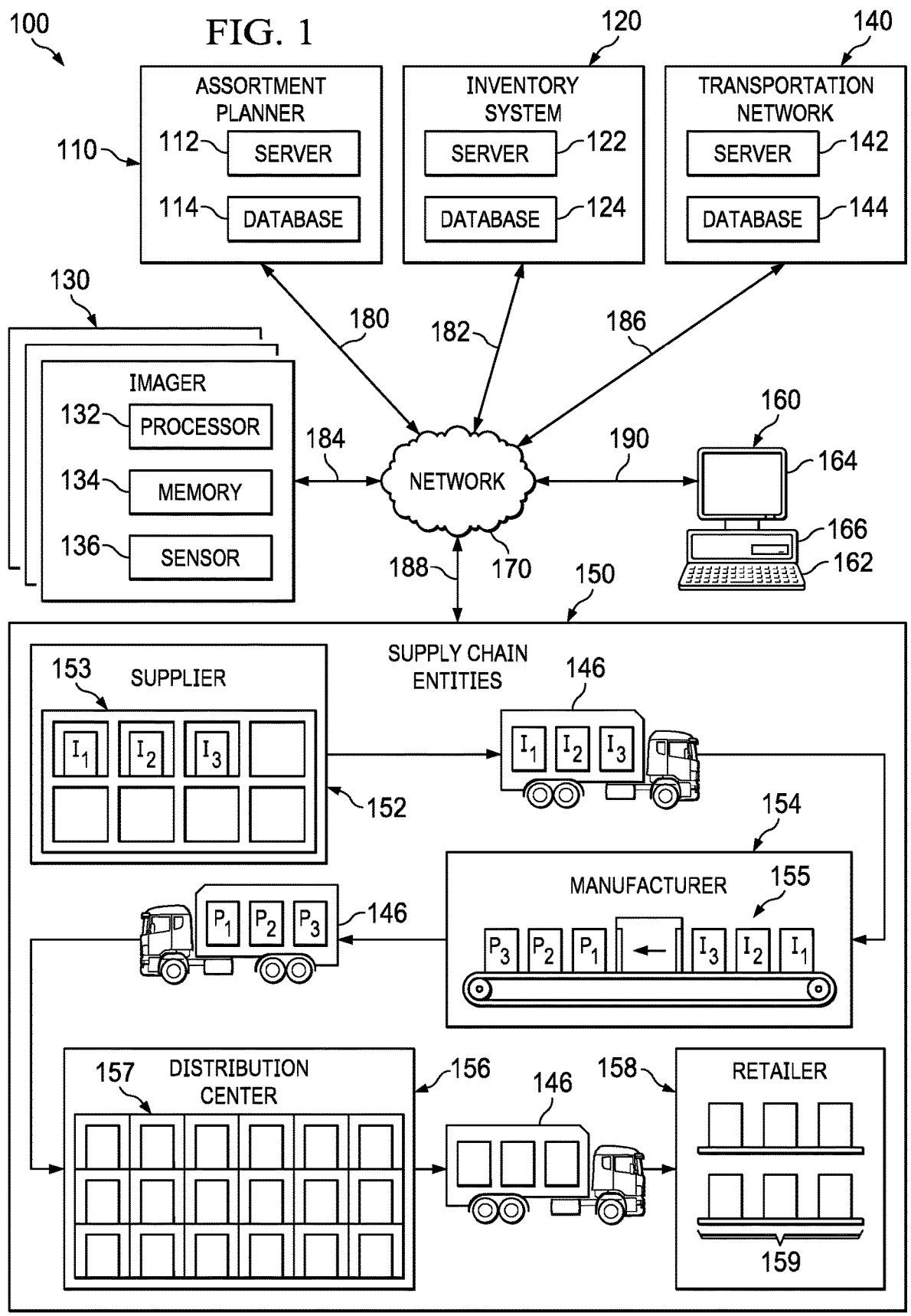
FIG. 1 illustrates an exemplary supply chain network according to a first embodiment.

Aspects and applications of the invention presented herein are described below in the drawings and detailed description of the invention. Unless specifically noted, it is intended that the words and phrases in the specification and the claims be given their plain, ordinary, and accustomed meaning to those of ordinary skill in the applicable arts.

In the following description, and for the purposes of explanation, numerous specific details are set forth in order to provide a thorough understanding of the various aspects of the invention. It will be understood, however, by those skilled in the relevant arts, that the present invention may be practiced without these specific details. In other instances, known structures and devices are shown or discussed more generally in order to avoid obscuring the invention. In many cases, a description of the operation is sufficient to enable one to implement the various forms of the invention, particularly when the operation is to be implemented in software. It should be noted that there are many different and alternative configurations, devices and technologies to which the disclosed inventions may be applied. The full scope of the inventions is not limited to the examples that are described below.

As described more fully below, aspects of the following disclosure relate to interactive visualization of similarity and transferable demand associated with product assortment planning in retailers. In the retail industry, a product, such as clothing, may be defined by one or more attributes, including, for example, color, material, design, pattern, length or the like. Each attribute may have a different attribute value. These attribute values include, for example, red, blue, green (for color), silk, cotton, polyester (for material), fashion, basic, classic (for design), striped, floral, plaid (for pattern), long, short, high, (for length), and other like attributes and attribute values, according to particular needs. These attribute values also determine, at least in part, customer preferences, individually and as customer segments defined by similar customer shopping behavior, preferences for purchasing items with particular attribute values, or a combination of both. One goal of assortment planning is to choose an assortment of products to sell during a planning period that matches predicted customer preferences during the planning period. As an example, this may include, for a clothing retailer, choosing an assortment of different clothing products that will match the style, colors, season, and trends predicted to be favored by customers during a planning period. Although assortment planning, attributes and attribute values are described in connection with a clothing retailer, embodiments contemplate assortment planning with attributes and attribute values of any retailer, including, for example, fashion retailers, grocery retailers, parts retailers, and the like.

Summarizing assortment data may be done using a tabular format, with rows or columns corresponding to products and attribute values. Using tabular data for assortment planning is problematic because tabular data does not show the overall similarity of the assortment or how products affect the sales of other products (i.e. the transferability of demand), which gives insight to how the exclusivity percentage for one or more products in an assortment is determined. For example, if a retailer has a little black dress that is a top seller but only carries similar little black dresses in all of their stores, the retailer will lose a lot of sales because the products (the black dresses) are so similar that consumers will not purchase very many of them. Additionally, with data displayed in a tabular format, insights and intuition are dulled by excess information. The tabular format makes it difficult to assess the diversity of an assortment this way, and to determine whether a product assortment is over-assorted, under-assorted, missing in exclusive products, and the like.

Embodiments of the following disclosure detail systems and methods of interactively visualizing and selecting assortment products based, at least in part, on similarity and transferable demand. According to a first approach of similarity and transferable demand interactive visualization, embodiments disclose a similarity method that computes the similarity between products and reduces the dimensionality in a set of coordinates based on the attributes that the products share in common. This approach uses a similarity function to construct a similarity matrix of the products in the assortment representing how similar each product is compared with another product. The similarity matrix is used as the basis for computing the coordinates for each product in an n-dimensional space. This approach aims at visually representing the overall inter-product similarities in an assortment by generating an interactive two-dimensional assortment visualization.

According to a second approach of similarity and transferable demand interactive visualization, embodiments disclose a visualization method that determines products which share a similar status in terms of their performance as well as in terms of their exclusivity. This allows assortment planning decisions to account for both individual product performance and influences a product has on other products' performances.

FIG. 1 illustrates exemplary supply chain network 100 according to a first embodiment. Supply chain network 100 comprises assortment planner 110, inventory system 120, one or more imagers 130, transportation network 140, one or more supply chain entities 150 150, computer 160, network 170, and communication links 180-190. Although a single assortment planner 110, a single inventory system 120, one or more imagers 130, a single transportation network 140, one or more supply chain entities 150, a single computer 160, a single network 170, and one or more communication links 180-190 are shown and described, embodiments contemplate any number of assortment planners, inventory systems, imagers, transportation systems, supply chain entities, computers, networks, or communication links, according to particular needs.

In one embodiment, assortment planner 110 comprises server 112 and database 114. As explained in more detail below, assortment planner 110 computes product similarity, generates one or more assortment planning visualizations of product similarity and transferable demand, determines product assortments, and places orders for products in the assortment.

Inventory system 120 comprises server 122 and database 124. Server 122 of inventory system 120 is configured to receive and transmit item data, including item identifiers, pricing data, attribute data, inventory levels, and other like data about one or more items at one or more locations in supply chain network 100. Server 122 stores and retrieves item data from database 124 or one or more locations in supply chain network 100.

One or more imagers 130 comprise one or more electronic devices that receive imaging information from one or more sensors 136 or from one or more databases in supply chain network 100. According to embodiments, one or more imagers 130 comprise one or more processors 132, memory 134, and one or more sensors 136 and may include any suitable input device, output device, fixed or removable computer-readable storage media, or the like. According to embodiments, one or more imagers 130 identify items near the one or more sensors 136 and generate a mapping of the item in supply chain network 100. As explained in more detail below, inventory system 120 and transportation network 140 use the mapping of an item to locate the item in supply chain network 100. The location of the item is then used to coordinate the storage and transportation of items in supply chain network 100 to implement one or more product assortments generated by assortment planner 110.

One or more imagers 130 may comprise a mobile handheld device such as, for example, a smartphone, a tablet computer, a wireless device, or the like. In addition, or as an alternative, one or more imagers 130 comprise one or more networked electronic devices configured to transmit item identity information to one or more databases as an item passes by or is scanned by one or more imagers 130. This may include, for example, a stationary scanner located at one or more supply chain entities 150 that identifies items as the items pass near the scanner, such as, for example, a point of sale system at one or more retailers 158 that records transaction data and associates the transaction data with product data, including, for example, associating customer identity data, store data, market data, time data, price data, discount data, and the like with product identity data and attribute data. One or more sensors 136 of one or more imagers 130 may comprise an imaging sensor, such as, a camera, scanner, electronic eye, photodiode, charged coupled device (CCD), or any other electronic or manual sensor that detects images of objects. In addition, or as an alternative, one or more sensors 136 may comprise a radio receiver and/or transmitter configured to read an electronic tag, such as, for example, an RFID tag.

Transportation network 140 comprises server 142 and database 144. According to embodiments, transportation network 140 directs one or more transportation vehicles 146 to ship one or more items between one or more supply chain entities 150, based, at least in part, on the product assortment generated by assortment planner 110. Transportation vehicles 146 comprise, for example, any number of trucks, cars, vans, boats, airplanes, unmanned aerial vehicles (UAVs), cranes, robotic machinery, or the like. Transportation vehicles 146 may comprise radio, satellite, or other communication that communicates location information (such as, for example, geographic coordinates, distance from a location, global positioning satellite (GPS) information, or the like) with assortment planner 110, inventory system 120, one or more imagers 130, transportation network 140, and/or one or more supply chain entities 150 to identify the location of the transportation vehicle 146 and the location of any inventory or shipment located on the transportation vehicle 146. In addition to the product assortment, the number of items shipped by transportation vehicles 146 in transportation network 140 may also be based, at least in part, on an inventory policy, target service levels, the number of items currently in stock at one or more supply chain entities 150, the number of items currently in transit in transportation network 140, forecasted demand, a supply chain disruption, and the like.

As shown in FIG. 1, supply chain network 100 operates on one or more computers 160 that are integral to or separate from the hardware and/or software that support assortment planner 110, inventory system 120, one or more imagers 130, transportation network 140, and one or more supply chain entities 150. Computers 160 may include any suitable input device 162, such as a keypad, mouse, touch screen, microphone, or other device to input information. Output device 164 may convey information associated with the operation of supply chain network, including digital or analog data, visual information, or audio information. Computer 160 may include fixed or removable computer-readable storage media, including a non-transitory computer readable medium, magnetic computer disks, flash drives, CD-ROM, in-memory device or other suitable media to receive output from and provide input to supply chain network 100. Computer 160 may include one or more processors 166 and associated memory to execute instructions and manipulate information according to the operation of supply chain network 100 and any of the methods described herein. In addition, or as an alternative, embodiments contemplate executing the instructions on computer 160 that cause computer 160 to perform functions of the method. Further examples may also include articles of manufacture including tangible computer-readable media that have computer-readable instructions encoded thereon, and the instructions may comprise instructions to perform functions of the methods described herein. According to some embodiments, the functions and methods described in connection with one or more imagers 130 may be emulated by one or more modules configured to perform the functions and methods as described.

In addition, and as discussed herein, supply chain network 100 may comprise a cloud-based computing system having processing and storage devices at one or more locations, local to, or remote from assortment planner 110, inventory system 120, one or more imagers 130, transportation network 140, and one or more supply chain entities 150. In addition, each of one or more computers 160 may be a work station, personal computer (PC), network computer, notebook computer, tablet, personal digital assistant (PDA), cell phone, telephone, smartphone, wireless data port, augmented or virtual reality headset, or any other suitable computing device. In an embodiment, one or more users may be associated with assortment planner 110, inventory system 120, one or more imagers 130, transportation network 140, and one or more supply chain entities 150. These one or more users may include, for example, a "buyer" or a "planner" handling retail product assortment, managing the inventory of items, imaging items, managing storage and shipment of items, and/or one or more related tasks within supply chain network 100. In addition, or as an alternative, these one or more users within supply chain network 100 may include, for example, one or more computers 160 programmed to autonomously handle, among other things, evaluation of various levels of retail process management, determining an assortment plan, forecasting demand, controlling manufacturing equipment, and adjusting various levels of manufacturing and inventory levels at various stocking points and distribution centers, and/or one or more related tasks within supply chain network 100.

Supply chain entities 150 represent one or more supply chain networks 100, including one or more enterprises, such as, for example networks of one or more suppliers 152, manufacturers 154, distribution centers 156, retailers 158 (including brick and mortar and online stores), customers, and/or the like. Suppliers 152 may be any suitable entity that offers to sell or otherwise provides one or more items (i.e., materials, components, or products) to one or more manufacturers 154. Suppliers 152 may comprise automated distribution systems 153 that automatically transport products to one or more manufacturers 154 based, at least in part, on a product assortment determined by assortment planner 110 and/or one or more other factors described herein. In addition, or as an alternative, each of the one or more items may be represented in supply chain network 100 by an identifier, including, for example, Stock-Keeping Unit (SKU), Universal Product Code (UPC), serial number, barcode, tag, RFID, or any other device that encodes identifying information. As discussed above, one or more imagers 130 may generate a mapping of one or more items in supply chain network 100 by scanning an identifier associated with an item or associating the image of an item with an identifier stored in a database.

Manufacturers 154 may be any suitable entity that manufactures at least one product. Manufacturers 154 may use one or more items during the manufacturing process to produce any manufactured, fabricated, assembled, or otherwise processed item, material, component, good or product. In one embodiment, a product represents an item ready to be supplied to, for example, one or more supply chain entities 150 in supply chain network 100, such as retailers 152, an item that needs further processing, or any other item. Manufacturers 154 may, for example, produce and sell a product to suppliers 152, other manufacturers 154, distribution centers 156, retailers 158, a customer, or any other suitable person or entity. Manufacturers 154 may comprise automated robotic production machinery 155 that produce products based, at least in part, on a product assortment determined by assortment planner 110 and/or one or more other factors described herein.

Distribution centers 156 may be any suitable entity that offers to store or otherwise distribute at least one product to one or more retailers 158 and/or customers. Distribution centers 156 may, for example, receive a product from a first one or more supply chain entities 150 in supply chain network 100 and store and transport the product for a second one or more supply chain entities 150. Distribution centers 156 may comprise automated warehousing systems 157 that automatically remove products from and place products into inventory based, at least in part, on a product assortment determined by assortment planner 110 and/or one or more other factors described herein.

Retailers 158 may be any suitable entity that obtains one or more products to sell to one or more customers. Retailers 158 may comprise any online or brick and mortar store, including stores with shelving systems 159. Shelving systems 159 may comprise, for example, various racks, fixtures, brackets, notches, grooves, slots, or other attachment devices for fixing shelves in various configurations. These configurations may comprise shelving systems 159 with adjustable lengths, heights, and other arrangements, which may be adjusted by an employee of retailers based on computer-generated instructions or automatically by machinery to place products in a desired location in retailers.

Although one or more supply chain entities 150 are shown and described as separate and distinct entities, the same entity may simultaneously act as any one of supply chain entities 150. For example, one or more supply chain entities 150 acting as a manufacturer 154 can produce a product, and the same entity can act as supplier 152 to supply an item to itself or another of one or more supply chain entity 150. Although one example of supply chain network 100 is shown and described, embodiments contemplate any configuration of supply chain network 100, without departing from the scope described herein.

In one embodiment, assortment planner 110 may be coupled with network 170 using communications link 180, which may be any wireline, wireless, or other link suitable to support data communications between assortment planner 110 and network 170 during operation of supply chain network 100. Inventory system 120 may be coupled with network 170 using communications link 182, which may be any wireline, wireless, or other link suitable to support data communications between inventory system 120 and network 170 during operation of supply chain network 100. One or more imagers 130 are coupled with network 170 using communications link 184, which may be any wireline, wireless, or other link suitable to support data communications between one or more imagers 130 and network 170 during operation of supply chain network 100. Transportation network 140 may be coupled with network 170 using communications link 186, which may be any wireline, wireless, or other link suitable to support data communications between transportation network 140 and network 170 during operation of supply chain network 100. One or more supply chain entities 150 may be coupled with network 170 using communications link 188, which may be any wireline, wireless, or other link suitable to support data communications between one or more supply chain entities 150 and network 170 during operation of supply chain network 100. Computer 160 may be coupled with network 170 using communications link 190, which may be any wireline, wireless, or other link suitable to support data communications between computer 160 and network 170 during operation of supply chain network 100.

Although communication links 180-190 are shown as generally coupling assortment planner 110, inventory system 120, one or more imagers 130, transportation network 140, one or more supply chain entities 150, and computer 160 to network 170, each of assortment planner 110, inventory system 120, one or more imagers 130, transportation network 140, one or more supply chain entities 150, and computer 160 may communicate directly with each other, according to particular needs.

In another embodiment, network 170 includes the Internet and any appropriate local area networks (LANs), metropolitan area networks (MANs), or wide area networks (WANs) coupling assortment planner 110, inventory system 120, one or more imagers 130, transportation network 140, one or more supply chain entities 150, and computer 160. For example, data may be maintained by locally or externally of assortment planner 110, inventory system 120, one or more imagers 130, transportation network 140, one or more supply chain entities 150, and computer 160 and made available to one or more associated users of assortment planner 110, inventory system 120, one or more imagers 130, transportation network 140, one or more supply chain entities 150, and computer 160 using network 170 or in any other appropriate manner. For example, data may be maintained in a cloud database at one or more locations external to assortment planner 110, inventory system 120, one or more imagers 130, transportation network 140, one or more supply chain entities 150, and computer 160 and made available to one or more associated users of assortment planner 110, inventory system 120, one or more imagers 130, transportation network 140, one or more supply chain entities 150, and computer 160 using the cloud or in any other appropriate manner. Those skilled in the art will recognize that the complete structure and operation of network 170 and other components within supply chain network 100 are not depicted or described. Embodiments may be employed in conjunction with known communications networks and other components.

In accordance with the principles of embodiments described herein, assortment planner 110 performs an interactive visualization analysis to determine an assortment of products based, at least in part, on the attribute values of the products in the assortment. For example, when a product is removed from an assortment, a set of attribute values is removed and the shares of the products can be distributed to other products by considering and ranking the products with a similar set of attribute values. Likewise, when an exclusive product is removed from the assortment, a set of attribute values is removed and the shares of the products will not be distributed to other products because no other substitutable products are available. In addition, or as an alternative, assortment planner 110 monitors the inventory of the one or more products and adjusts the inventory, product assortment, removal or addition of items, new collection assortment of the retailer and/or supply chain entities based, at least in part, on the interactive visualization analysis.

According to embodiments, assortment planner 110 generates an assortment plan and determines an assortment of one or more products at a retailer and/or supply chain entity based, at least in part, on an interactive visualization analysis. Assortment planner 110 further generates product combinations, places product orders at various manufacturers 154 and/or distribution centers 156, initiates manufacturing of the products and determines products to be carried at various retailers 158. Additionally, or in the alternative, assortment planner 110 may generate a buy quantity for the inventory of one or more supply chain entities 150 in supply chain network 100. Furthermore, assortment planner 110, inventory system 120, and/or transportation network 140 may instruct automated machinery (i.e., robotic warehouse systems, robotic inventory systems, automated guided vehicles, mobile racking units, automated robotic production machinery, robotic devices and the like) to adjust product mix ratios, inventory levels at various stocking points, production of products of manufacturing equipment, proportional or alternative sourcing of one or more supply chain entities 150, and the configuration and quantity of packaging and shipping of products based, at least in part, on one or more generated assortment plans, determined assortments, inventory policies, and/or current inventory or production levels. For example, according to embodiments, assortment planner 110 determines a rate of sale and/or a purchase quantity for one or more products in one or more assortments, which is may be used, in combination with inventory policies or target service levels, to signify when the inventory quantity of an item reaches a particular level, the item may resupplied. Therefore, when the inventory of an item falls to a certain level, assortment planner 110 may initiate one or more processes that then automatically adjusts product mix ratios, inventory levels, production of products of manufacturing equipment, and proportional or alternative sourcing of one or more supply chain entities 150 until the inventory is resupplied to a target level.

For example, the methods described herein may include computers receiving product data from automated machinery having at least one sensor 136 and the product data corresponding to an item detected by the automated machinery. The received product data may include an image of the item, an identifier, as described above, and/or other product data associated with the item (dimensions, texture, estimated weight, and any other like data). The method may further include computers looking up the received product data in a database system associated with assortment planner 110, inventory system 120, and/or transportation network 140 to identify the item corresponding to the product data received from the automated machinery.

Computers 160 may also receive, from the automated machinery, a current location of the identified item. Based on the identification of the item, computers 160 may also identify (or alternatively generate) a first mapping in the database system, where the first mapping is associated with the current location of the item. Computers 160 may also identify a second mapping in the database system, where the second mapping is associated with a past location of the identified item. Computers 160 may also compare the first mapping and the second mapping to determine if the current location of the identified item in the first mapping is different than the past location of the identified item in the second mapping. Computers 160 may then send instructions to the automated machinery based, as least in part, on one or more differences between the first mapping and the second mapping such as, for example, to locate item to add to or remove from an inventory of or shipment for one or more supply chain entities 150. In addition, or as an alternative, assortment planner 110 monitors the supply chain constraints of one or more items at one or more supply chain entities 150 and adjusts the orders and/or inventory of supply chain entities 150 based on the supply chain constraints.

Figure 2:
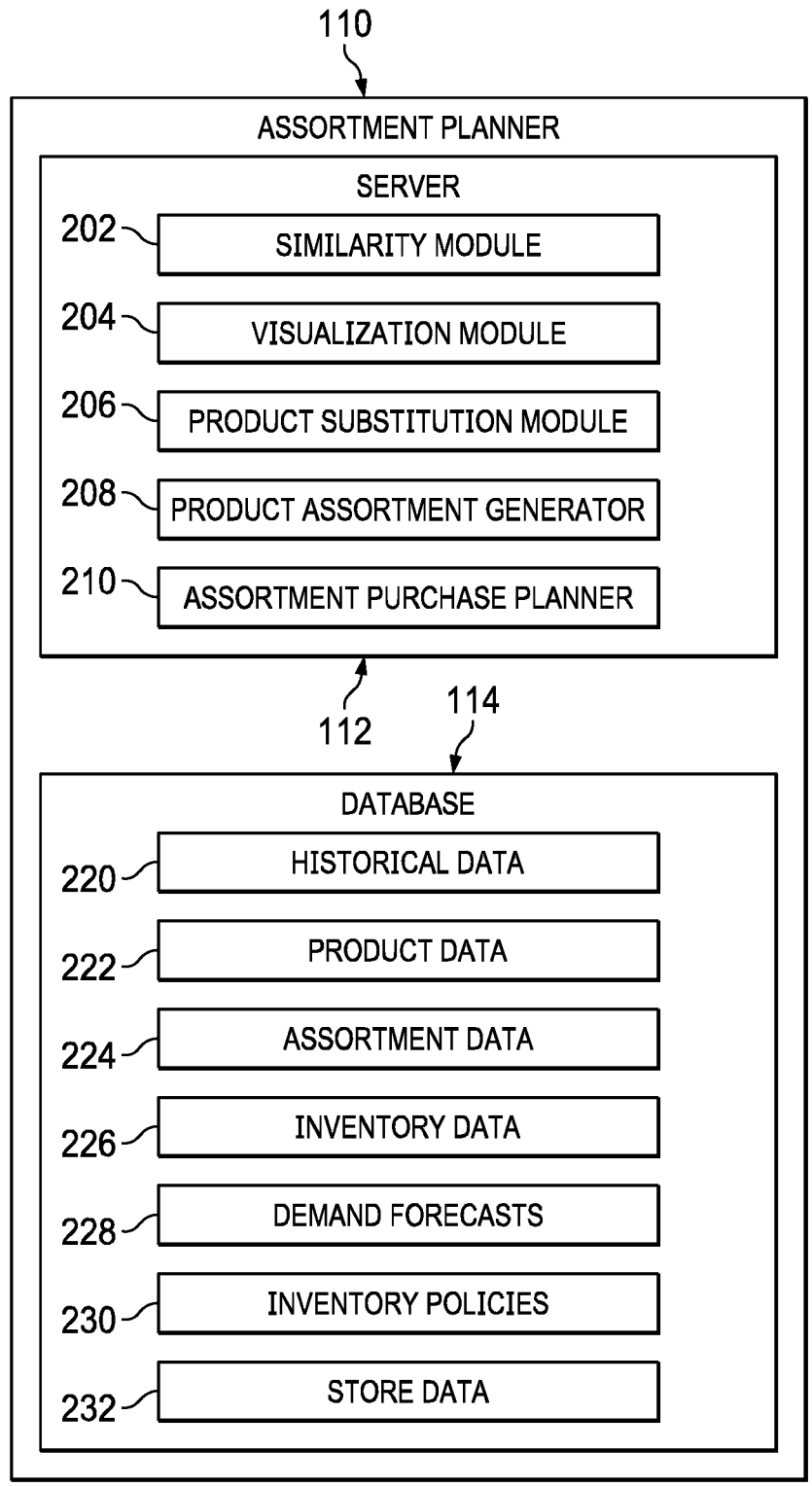
FIG. 2 illustrates the assortment planner of FIG. 1 in greater detail in accordance with an embodiment.

FIG. 2 illustrates assortment planner 110 of FIG. 1 in greater detail in accordance with an embodiment. As discussed above, assortment planner 110 comprises server 112 and database 114. Although assortment planner 110 is shown as comprising a single server 112 and a single database 114, embodiments contemplate any suitable number of servers or databases internal to or externally coupled with assortment planner 110, according to particular needs. According to some embodiments, assortment planner 110 may be located internal to one or more retailers 158 of one or more supply chain entities 150. In other embodiments, assortment planner 110 may be located external to one or more retailers 158 of one or more supply chain entities 150 and may be located in for example, a corporate retailer of the one or more retailers 158, according to particular needs.

Server 112 of assortment planner 110 may comprise similarity module 202, visualization module 204, product substitution module 206, and product assortment generator 208. Although server 112 is shown and described as comprising a single similarity module 202, visualization module 204, product substitution module 206, and product assortment generator 208, embodiments contemplate any suitable number or combination of these located at one or more locations, local to, or remote from assortment planner 110, such as on multiple servers or computers at any location in supply chain network 100.

Similarity module 202 computes the similarity between each pair of products in a product assortment. According to embodiments, similarity module 202 generates similarity matrix 400 (FIG. 4), determines coordinates to represent a product in an assortment in an assortment visualization, and summarizes the product similarity, which is used as the basis for n-dimensional mapping. Visualization module 204 generates an assortment visualization which displays products in terms of individual sales performance and uniqueness. According to embodiments, visualization module 204 graphically displays product performance interactions which help users more easily select products for a product assortment.

Product substitution module 206 generates a visualization of transferable demand that represents how the demand transfers between the products in an assortment. According to embodiments, product substitution module 206 displays a graphical user interface (GUI) that allows a user to navigate products in a product assortment and visualize the transferable demand among them. Product assortment generator 208 of assortment planner 110 generates product assortment by indicating the products that will be included or excluded in a product assortment for a particular planning period. The product assortment may be based on, for example, data regarding sales, profitability, transferable demand, similarity, or the like for any one or more products or assortments. Assortment purchase planner 210 may calculate a purchase quantity of items in an assortment and place an order based on, for example, a new product assortment.

Database 114 of assortment planner 110 may comprise one or more databases or other data storage arrangement at one or more locations, local to, or remote from, server 112. Database 114 comprises, for example, historical data 220, product data 222, assortment data 224, inventory data 226, demand forecasts 228, inventory policies 230, and store data 232. Although, database 114 is shown and described as comprising historical data 220, product data 222, assortment data 224, inventory data 226, demand forecasts 228, inventory policies 230, and store data 232, embodiments contemplate any suitable number or combination of these, located at one or more locations, local to, or remote from, assortment planner 110 according to particular needs.

Historical data 220 may comprise data relating to the one or more products, including, for example, sales data, geographical regions, store locations, inventory data, time periods, seasonality, or other types of dimensions. In addition, the historical data may be represented by any suitable combination of values and dimensions, aggregated or un-aggregated, such as, for example, transaction data, sales per week, sales per week per location, sales per day, sales per day per season, or the like. The transaction data may comprise data that records sales transactions and related data, including, for example, a transaction identification, time and date stamp, store identification, product identification, actual cost, selling price, sales quantity, customer identification, and or the like.

Product data 222 of database 114 may comprise one or more data structures comprising products identified by, for example, a product identification (such as a Stock Keeping Unit (SKU), Universal Product Code (UPC) or the like) and one or more attributes and attribute values associated with the product ID, which may be stored as attribute data. Product data 222 may comprise any attributes or attribute values of one or more products organized according to any suitable database structure, and sorted by, for example, attribute, attribute value, product identification, or any suitable categorization or dimension. Attributes of one or more items may be, for example, any categorical characteristic or quality of an item, and an attribute value may be a specific value or identity for the one or more items according to the categorical characteristic or quality.

As an example only and not by way of limitation, a product, such as for example, a shirt, may comprise the attributes of gender, season, article of clothing, color, sleeve-length, price segment, pattern, or the like. Attribute values for these attributes may comprise, for example, male or female, for gender; spring, summer, fall, winter, for season;

top, blouse, shirt, bottom, pants, shorts, skirt, or the like, for article of clothing; red, blue, green, or the like, for color; long, short, medium, or the like, for sleeve-length; good, better, best, for price segment; stripe, checked, plain, or the like, for pattern. Although particular products comprising particular attributes and attribute values are described herein, embodiments contemplate any item, attribute or attribute value, accordingly to particular needs.

Assortment data 224 of database 114 may comprise the identity of products selected for an assortment and the attribute values associated with those products.

Inventory data 226 of database 114 may comprise any data relating to current or projected inventory quantities or states, order rules, or the like. For example, inventory data 226 may comprise the current level of inventory for each item at one or more stocking points across supply chain network 100. In addition, inventory data 226 may comprise order rules that describe one or more rules or limits on setting an inventory policy, including, but not limited to, a minimum order quantity, a maximum order quantity, a discount, and a step-size order quantity, and batch quantity rules. According to some embodiments, inventory data 226 may comprise explanatory variables that describe the data relating to specific past, current, or future indicators and the data of promotions, seasonality, special events (such as sporting events), weather, and the like. According to some embodiments, assortment planner 110 accesses and stores inventory data 226 in database 114, which may be used by assortment planner 110 to place orders, set inventory levels at one or more stocking points, initiate manufacturing of one or more components, or the like. In addition, or as an alternative, inventory data 226 may be updated by receiving current item quantities, mappings, or locations from inventory system 120, one or more imagers 130, and/or transportation system 140.

Demand forecasts 228 of database 114 may indicate future expected demand based on, for example, any data relating to past sales, past demand, purchase data, promotions, events, or the like of one or more supply chain entities 150. Demand forecasts 228 may cover a time interval such as, for example, by the minute, hour, daily, weekly, monthly, quarterly, yearly, or any suitable time interval, including substantially in real time.

Inventory policies 230 of database 114 may comprise any suitable inventory policy describing the reorder point and target quantity, or other inventory policy parameters that set rules for assortment planner 110 to manage and reorder inventory. Inventory policies 230 may be based on target service level, demand, cost, fill rate, or the like. According to embodiment, inventory policies 230 comprise target service levels that ensure that a service level of one or more supply chain entities 150 is met with a certain probability. For example, one or more supply chain entities 150 may set a service level at 95%, meaning Supply chain entities 150 will set the desired inventory stock level at a level that meets demand 95% of the time. Although, a particular service level target and percentage is described; embodiments contemplate any service target or level, for example, a service level of approximately 99% through 90%, a 75% service level, or any suitable service level, according to particular needs. Other types of service levels associated with inventory quantity or order quantity may comprise, but are not limited to, a maximum expected backlog and a fulfillment level. Once the service level is set, assortment planner 110 may determine a replenishment order according to one or more replenishment rules, which, among other things, indicates to one or more supply chain entities 150 to determine or receive inventory to replace the depleted inventory.

Store data 232 of database 114 may comprise data describing the stores of one or more retailers 154 and related store information. Store data 232 may comprise, for example, a store ID, store description, store location details, store location climate, store type, store opening date, lifestyle, store area (expressed in, for example, square feet, square meters, or other suitable measurement), latitude, longitude, and other like store data.

Figures 3, 4:
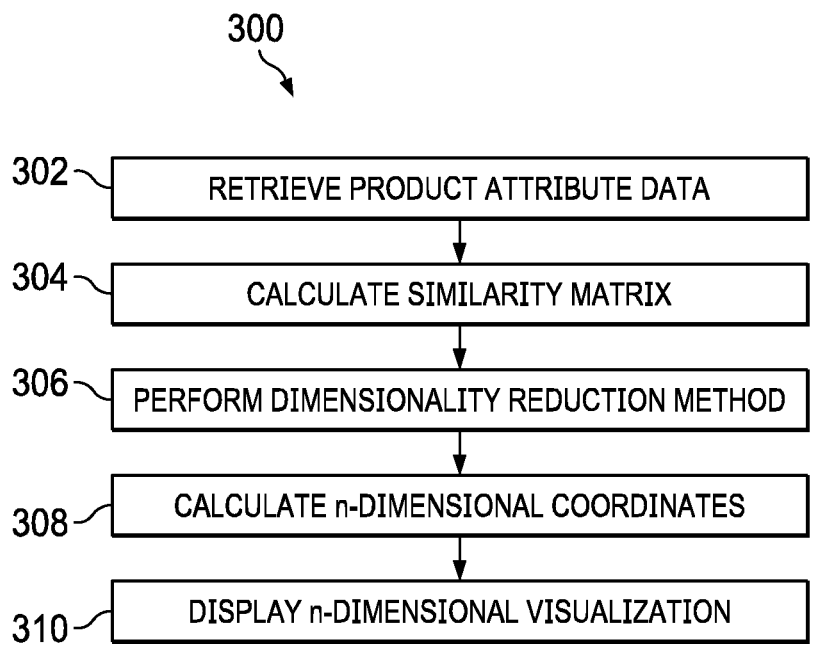
FIG. 3 illustrates an exemplary method of generating an interactive two-dimensional assortment visualization, according to an embodiment.
FIG. 4 illustrates an exemplary similarity matrix, according to an embodiment.

FIG. 3 illustrates an exemplary method of generating an interactive two-dimensional assortment visualization based on product similarity, according to an embodiment. Although actions of the method are described in a particular order, embodiments contemplate actions performed in any suitable order or combination according to particular needs.

At action 302, assortment planner receives product data. According to embodiments, assortment planner 110 receives product data 222 from one or more supply chain entities 150 in supply chain network 100 for one or more products and stores the data in the database of assortment planner 110. At action 304, assortment planner generates a similarity matrix 400 (FIG. 4) from product data. As explained in more detail below, similarity module 202 generates similarity matrix 400 comprising the similarity of product attribute values between various products.

At action 306, assortment planner 110 performs a dimensionality reduction method on the similarity matrix 400. As explained in more detail below, similarity module 202 reduces similarity matrix 400 from an n×n matrix to an n×2 or n×3 matrix. At action 308, assortment planner 110 generates n-dimensional coordinates based, at least in part, on the reduced matrix.

At action 310, assortment planner 110 generates a two-dimensional visualization of product similarity. As explained in more detail below, similarity module 202 displays a two-dimensional visualization, which may also comprise a user interface for selecting products in a product assortment. Although the visualization is described as a two-dimensional visualization, embodiments contemplate a three-dimensional visualization, such as, for example, displayed on a virtual or augmented reality headset or a display (such as, for example, a monitor, projector, or the like) capable of displaying three-dimensional images.

To further describe method 300 of generating an interactive n-dimensional assortment visualization based on product similarity, an example is now given. In the following example, and after receiving product data, similarity module 202 generates a similarity matrix by computing the similarity between different products. That is, the similarity module uses a similarity function to construct a square symmetric similarity matrix of all of the products in the assortment based on the attribute values of the products and which provides data representing how similar each product is compared with another product. The square symmetric similarity matrix summarizes the similarity between every possible pair of products and as discussed below in more detail, is used as the basis for n-dimensional mapping.

FIG. 4 illustrates an exemplary similarity matrix 400, according to an embodiment. According to embodiments, similarity matrix 400 comprises an x-axis that lists a set of products plotted against a y-axis, comprising an identical set of products. Each intersection of a product from the x-axis with a product on the y-axis indicates the similarity between those two products, as defined by a similarity function. According to an embodiment, the similarity function quantifies the similarity between products, based on a comparison of their respective attribute values.

According to a first embodiment, the similarity function comprises the percentage of attributes that share the same attribute values between two products. As a simple example only and not by way of limitation, if a first product is a blue dress and a second product is a red dress and the products are assumed to have only two attributes (type, and color), then the similarity calculated by this similarity function is 50%, because both products have the same value for the attribute (dress), but both products have a different value for the "color" attribute (red vs. blue).

As another example only and not by way of limitation, similarity matrix 400 indicates that the similarity between a first product (Product 0) and a second product (Product 1) is 76%, which indicates a difference between some attribute values between the two products. Because each product is represented on both the x-axis and the y-axis, the similarity of each product is also compared with itself. For example, the similarity between a first product (Product 0) on the x-axis and itself (Product 0) on the y-axis is 100%, which would be expected because this indicates the similarity between a product and itself. Other percentages of similarity between the remaining products are equal to the percentages indicated in similarity matrix 400.

According to further embodiments, the similarity function may comprise the number of identical attribute values between two products, weighted by the importance of each attribute. According to another embodiment, the similarity function comprises a cosine distance.

Once the similarity between the products are quantified, similarity module 202 maps similarity matrix 400 onto an n-dimensional visualization by reducing the dimensionality in the set of vectors using a dimensionality reduction method to visualize the product assortment similarity. In addition, or as an alternative, similarity module 202 uses the dimensionality reduction method to produce the visualization from a set of products in an assortment that has similarity i.e., a set of products that share or do not share some attribute values.

Figure 5:
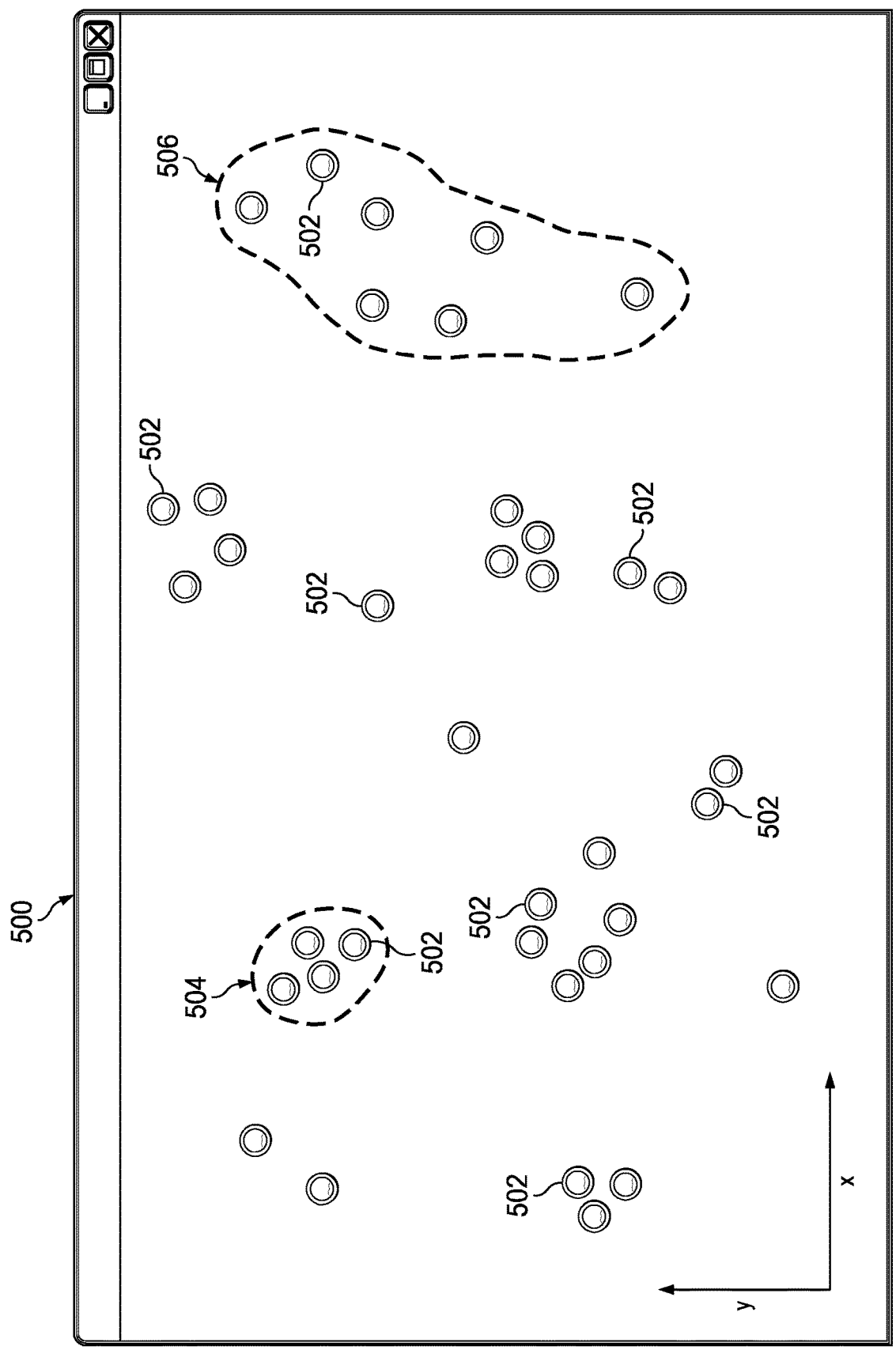
FIG. 5 illustrates an exemplary two-dimensional assortment visualization, according to an embodiment.

FIG. 5 illustrates an exemplary two-dimensional visualization 500, according to an embodiment. Two-dimensional visualization 500 comprises various bubbles 502 that each represent a product in an assortment. As described in more detail below, the location on two-dimensional visualization 500 where bubbles 502 are displayed indicate the similarity of the products represented by bubbles 502. Two-dimensional visualization 500 comprises an x-axis and a y-axis. The (x,y) coordinate of a given bubble 502 relative to any other bubble 502 indicates the similarity or exclusivity of the products represented by bubbles 502 in the product assortment. Products which have mostly similar attribute values are represented by bubbles 502 that are positioned closely together. Similar products may, for example, be represented by patterns of bubbles 502 clustered closely together, such as, for example, the closely clustered products in area 504. Products which have less similar attribute values are represented by bubbles 502 that are positioned further from each other. Less similar products may, for example, be represented by patterns of bubbles 502 clustered further apart, such as, for example, the distantly clustered products in area 506. The more distantly any of bubbles 502 are positioned from each other on two-dimensional visualization 500, the more different the attribute values of the products represented by bubbles 502 are. Although a particular two-dimensional visualization 500 is shown and described, embodiments contemplate a three-dimensional visualization, four-dimensional visualization, or any n-dimensional visualization, according to particular needs.

As discussed above, similarity module 202 determines the (x, y) coordinates from similarity matrix 400 computed with the similarity function between all pairs of products. This is obtained by the consistent description of products by means of distinct attributes and respective possible attribute values. In one embodiment, similarity module 202 computes the similarity between two products by averaging the result of an attribute-wise comparison. Transforming the similarity matrix into (x, y) coordinates corresponds to performing dimensionality reduction on a set of vectors whose components share the same meaning.

In one embodiment, similarity module 202 uses a principal component analysis (PCA) algorithm as the dimensionality reduction method to determine the product assortment similarity. This method reduces the dimensionality of similarity matrix 400 while preserving as much variance as possible in the data. In addition, similarity module 202 transforms the square n×n matrix into a n×2 matrix, using the two remaining components as (x, y) coordinates. This method provides for clustering similar products together, as well as, spreading dissimilar products apart.

Figure 6:
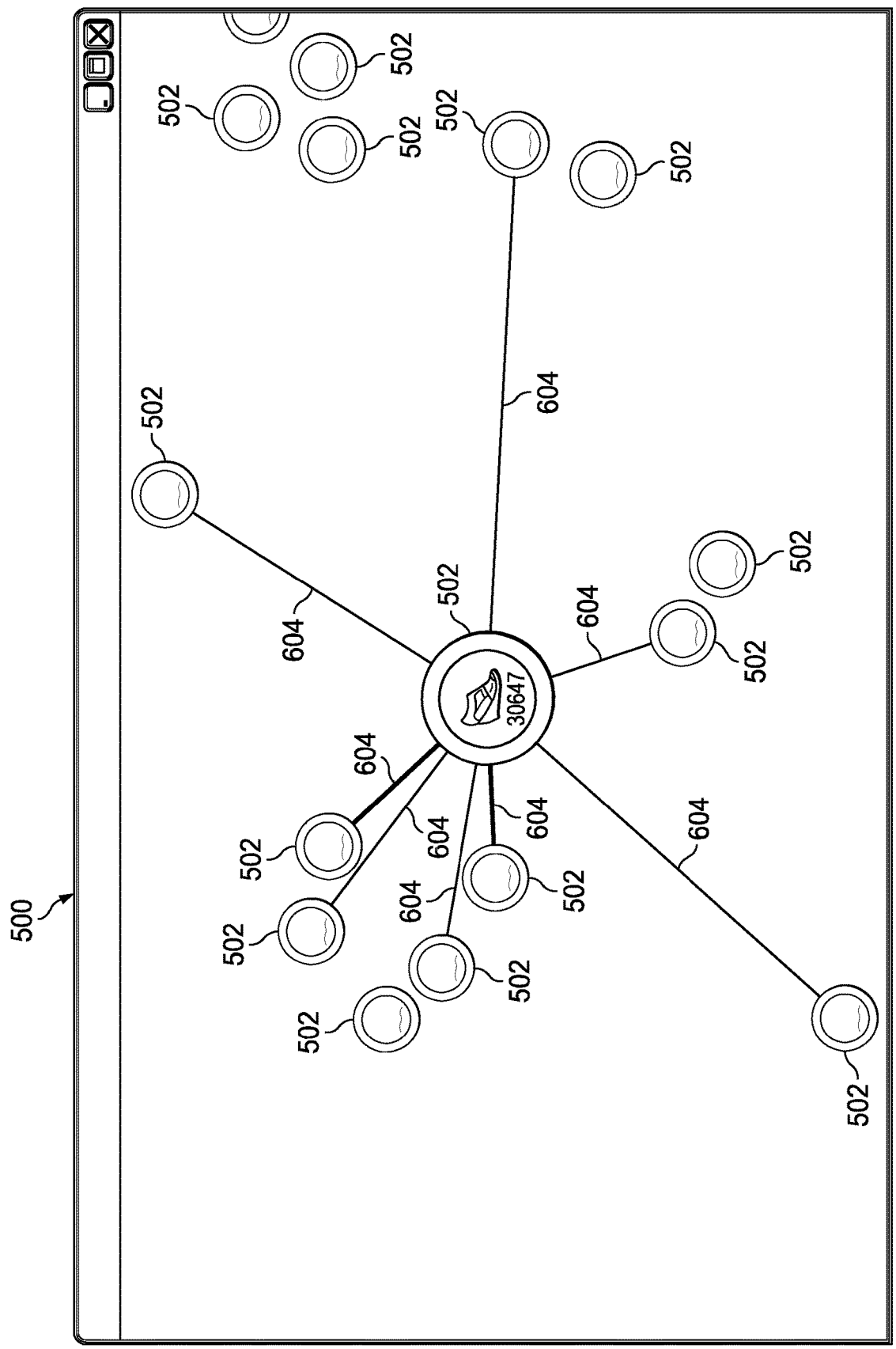
FIG. 6 illustrates an exemplary view of two-dimensional assortment visualization of FIG. 5, according to a further embodiment.

FIG. 6 illustrates an exemplary view of two-dimensional visualization 500 of FIG. 5, according to a further embodiment. As shown above, two-dimensional visualization 500 comprises a mouse-over of a bubble, representing a particular product illustrating a linking of other products that share similar attribute values. In addition, and as discussed in more detail below, additional information can be added to the dimensional visualization, such as, for example size and color of the bubbles representing products, which also may be used to represent past sales, exclusivity of a product, and the like. For example, as described below, user selection of a product generates a popup box with additional information or connectors which indicate its most similar neighbors. Additionally, or in the alternative, a size of the projected bubbles 502 may graphically indicate uniqueness, and a color of bubbles 502 may be used to indicate past sales performance, as described in more detail below.

According to embodiments, and as will be explained in more detail below, visualization module 204 of assortment planner 110 displays products which share a similar status in terms of their performance as well as in terms of their exclusivity.

Figure 7:
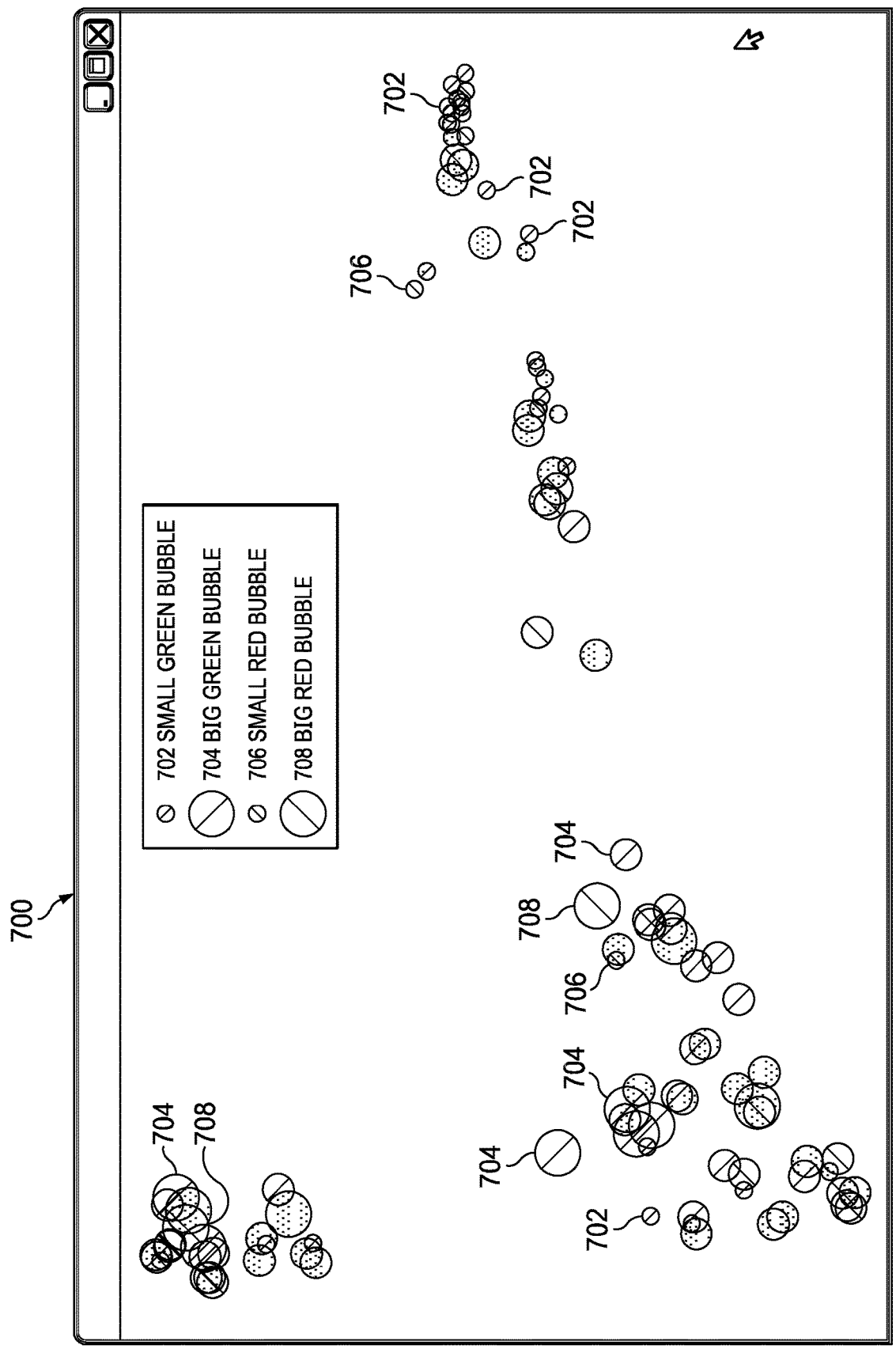
FIG. 7 illustrates an exemplary interactive two-dimensional assortment visualization according to an embodiment.

FIG. 7 illustrates an exemplary interactive two-dimensional visualization 700 according to an embodiment. Visualization module 204 of assortment planner 110 provides an interactive two-dimensional visualization 700 that represents various assortment scenarios. As discussed above, each bubble 502 in two-dimensional visualization 500 represents a product in an assortment. However, according to embodiments, interactive two-dimensional visualization 700 comprises size-variable and color-coded bubbles 702-708. Here, a size of bubbles 702-708 represents the uniqueness of the product based on the amount of demand that is exclusive to the product. For example, a larger bubble may represent a more exclusive product, and a smaller bubble may represent a less exclusive product. Bubbles 702-708 may comprise one or more intermediate sizes that represent exclusivity intermediate between the larger bubbles and the smaller bubbles. In other words, according to some embodiments, the larger a bubble is displayed on interactive two-dimensional visualization 700, the more exclusive the product represented by the bubble is, and the smaller a bubble is displayed on interactive two-dimensional visualization 700, the less exclusive the product represented by the bubble is.

In addition, a color of bubbles 702-708 may represent the performance or predictive performance of the product represented by the bubble 702-708. Performance or predictive performance may be based, at least in part, on, for example, historical or predicted sales performance. In this manner, bubbles 702-708 visually represent the exclusivity of the product, while simultaneously visually representing the performance of the product.

To further explain bubbles 702-708, several examples are now given. According to embodiments, products represented by small green bubbles 702 may have good performance (based on, for example, historical sales data) and may be highly similar to a lot of other products in the assortment, i.e. not unique top performers. That is, small green bubbles 702 may represent well-selling products that have many substitutable products. According to embodiments, when some products represented by small green bubbles 702 are removed from the assortment, global sales will remain largely unchanged, but may slightly decrease based, at least in part, on one or more good performers being removed from the assortment.

In addition, products represented by big green bubbles 704 may have good performance and may be highly unique in the assortment, i.e. unique top performers. That is, big green bubbles 704 may represent well-selling products, which are unique. When top performers are too unique, there may be a larger risk for that product to satisfy all the demand for the attribute values of that product. According to embodiments, when additional products with similar attribute values to the products represented by big green bubbles 704 are added to the assortment, overall sales may increase, because customers have different options for a set of attribute values associated with these products.

Further, products represented by small red bubbles 706 may have bad performance and may be highly similar to other products in the assortment, i.e. not unique bad performers. That is, small red bubbles 706 may represent products that are not performing well and are not unique. According to embodiments, when products represented by small red bubbles 706 are removed from the assortment, sales may not be impacted much because, in this case, every customer in the store would likely find substitutable products.

Finally, products represented by big red bubbles 708 may have bad performance, and few similar products in the assortment, i.e. unique bad performers. That is, big red bubbles 708 may represent products that are not performing well, but which are highly unique. According to embodiments, removing products represented by big red bubbles 708 from the assortment may impact the global sales since only a few substitutable products exist for these products, which in turn, means that sales to customers, will likely be lost.

Although particular representations of bubbles 702-708 are shown and described as particular colors and sizes, embodiments contemplate any particular size or color, representing any particular characteristics, according to particular needs. For example, according to some embodiments, bubbles may comprise a medium-sized bubble that indicates an amount of substitutability that is within a preselected or medium-amount of substitutability.

Figure 8:
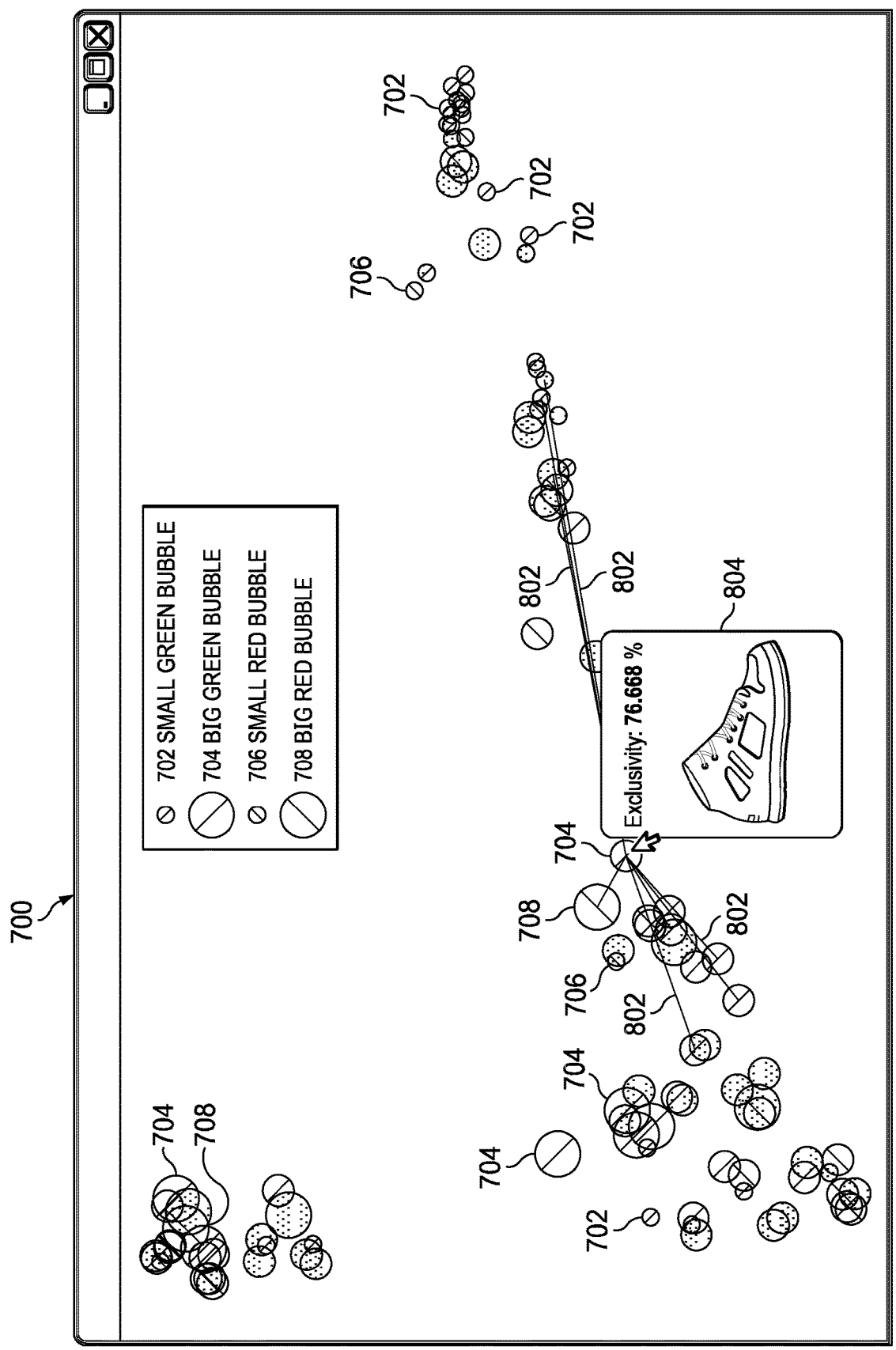
FIG. 8 illustrates an exemplary view of the interactive two-dimensional assortment visualization of FIG. 7, according to to a further embodiment.

FIG. 8 illustrates an exemplary view of interactive two-dimensional visualization 700 of FIG. 7, according to an embodiment. Visualization module 202 of assortment planner 110 provides a more in-depth analysis by providing a visualization of transferable demand links 802 associated with products in an assortment. For example, embodiments contemplate an ability to look at the planning problem in different ways by navigating through transferable demand links 802 to identify similar products for each product as well as overlaying information in overlay 804. Overlay 804 may display information, such as, for example, the amount of exclusive sales that a product has as well as its historical sales performance.

The combination of different insights on a product's performance and uniqueness, provides visibility in making insightful decisions on which products to keep or remove from a product assortment. That is, interactive two-dimensional visualization 700 identifies products which are similar in the way they should be dealt with when choosing if they should be kept or removed. According to embodiments, interactive two-dimensional visualization 700 provides an interface to add or remove products from a product assortment.

Figure 9:
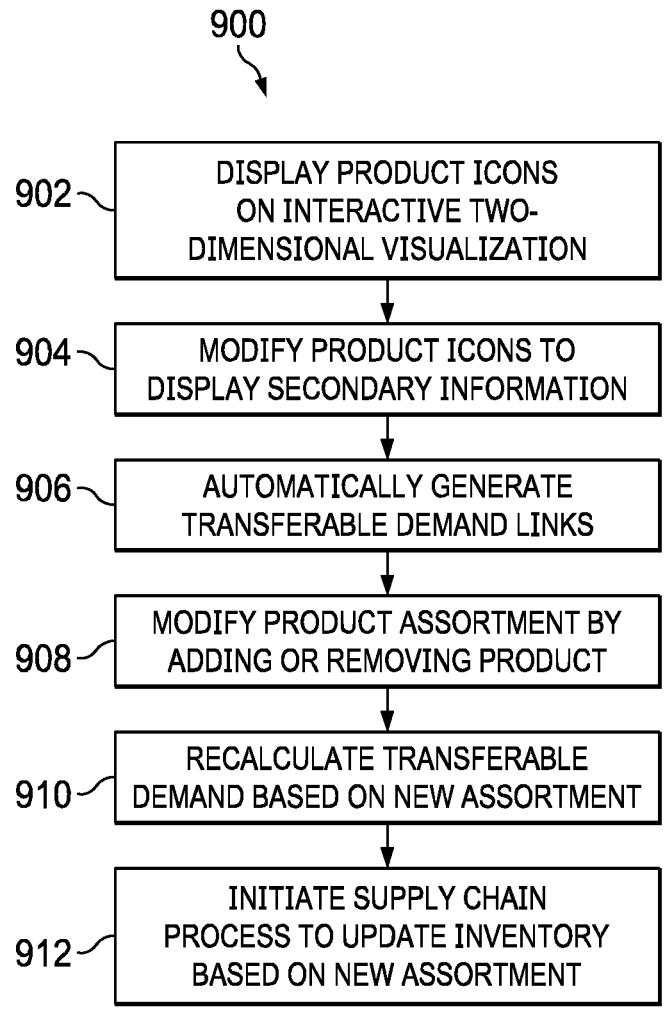
FIG. 9 illustrates an exemplary method of modifying a product assortment using interactive two-dimensional visualization, according to an embodiment.

FIG. 9 illustrates an exemplary method 900 of generating a product assortment using interactive two-dimensional visualization 700, according to an embodiment. Although actions of the method are described in a particular order, embodiments contemplate actions performed in any suitable order or combination according to particular needs.

At action 902, visualization module 204 displays icons representing two or more products in an assortment on interactive two-dimensional visualization 700, where the location of the icons indicates the similarity of the products represented by the icons. Although the examples are illustrated with icons comprising bubbles 702-708, embodiments contemplate any suitable icon according to particular needs. As explained above, products from an assortment are graphed onto the interactive two-dimensional visualization 700 according to similarity to provide an interface to select, add, and remove products from the product assortment, where products that are closer together are more similar, and products further away are less similar.

At action 904, visualization module 204 modifies icons to indicate secondary information, such as, for example, sales, uniqueness, and the like. For example, as described above, a size of the projected bubbles 502 may graphically indicate uniqueness, and a color of bubbles 502 may be used to indicate past sales performance. Although size and color are used to indicate uniqueness and past sales performance, embodiments contemplate any modification of icons to represent additional information according to particular needs.

At action 906, visualization module 204 identifies user selection of an icon, and, in response to the user selection, automatically generates transferable demand links 802 connecting the selected icon and all icons representing products which are similar to the product represented by the selected icon. For example, transferable demand indicates the predicted change in sales based on adding or removing an item from the product assortment. According to embodiments, transferable demand links represent transferable demand that meet a preselected threshold, such as, for example, greater than 40%, 50%, or any other preselected value.

At action 908, based on the connections between the selected product and all similar products, a user may choose to add a new product to the product assortment or remove a current product from the product assortment. For example, according to embodiments, assortment planner 110 may remove from the assortment one or more products represented by small red bubbles which indicate products that do not bring additional sales to the assortment. Further, assortment planner 110 may add products similar to the products represented by big green bubbles to diminish the exclusivity of these products (and which may result in visualization module 204 automatically recalculating and reducing the size of these bubbles). Additionally, assortment planner 110 remove products which have transferable demand links to one or more key products to reduce or eliminate substitutable options. According to embodiments, assortment planner 110 may test different assortments, including automatically testing different assortments. By testing different to find a mix of products that will generate increased sales.

At action 910, visualization module 204 identifies the modified product assortment and, in response, recalculates transferable demand. According to embodiments, visualization module 204 updates transferable demand links and bubble size and placement automatically based on the detection of a product being added or removed from the assortment or the modification of one or more attribute values of one or more products.

Although particular examples are given, embodiments contemplate removal or addition of any retail product from a product assortment, according to particular needs.

At action 912, assortment purchase planner 210 initiates one or more supply chain processes, as described above, to alter ranging decisions and inventory at one or more supply chain entities in reflect the new product assortment.

To further illustrate, addition and removal of an item from an assortment, an example is now given.

Figure 10:
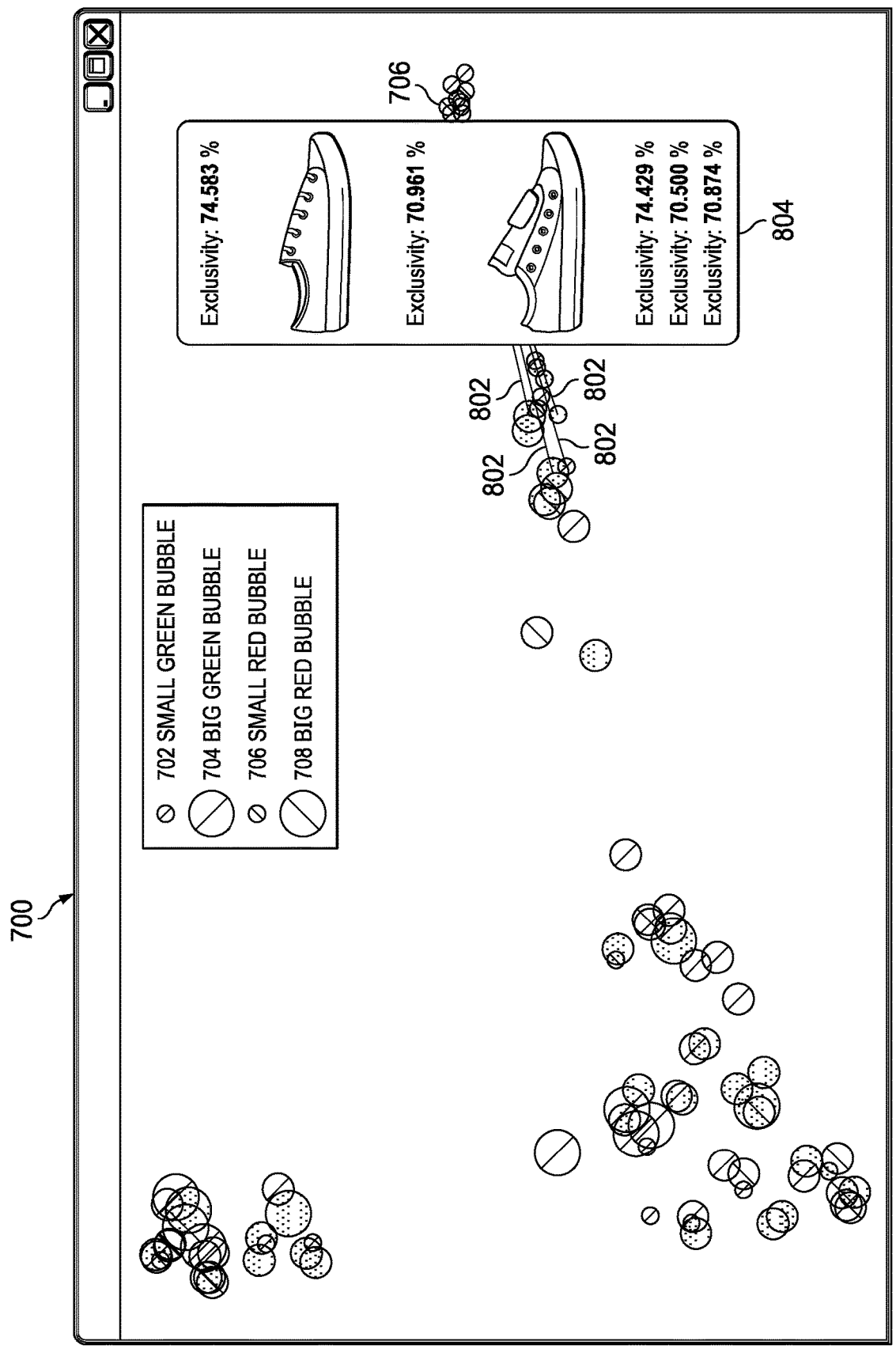
FIG. 10 illustrates an exemplary view of the interactive two-dimensional assortment visualization of FIG. 7, according to an embodiment.

FIG. 10 illustrates interactive two-dimensional visualization 700, according to a further embodiment. As discussed above, visualization module 204 generates bubbles 702-708 representing products in a product assortment where small green bubbles 702 represent not unique top performers, big green bubbles 704 represent unique top performers, small red bubbles 706 represent not unique bad performers, and large red bubbles 708 represent unique bad performers.

When visualization module 204 identifies user selection of an icon representing a product, visualization module 204 automatically generates transferable demand links 802 that identify those products which have transferable demand above a preselected value. Based on the displayed bubbles 702-708, transferable demand links 802, and/or overlay 804, a user may choose to add or remove a product from the product assortment. For example, as discussed above, small red bubble 706 represents products that are not performing well and are not unique. These products ordinarily may be removed from an assortment without likely affecting global sales. As shown below, attribute values of products linked to the exemplary product represented by small red bubble 706 share similar attribute values and, therefore, removing this product should not affect future sales.

Assuming that a user removes the product represented by the small red bubble 706 (here, a shoe), visualization module 204 identifies the modified product assortment and, in response, recomputes the size of the bubbles for the one or more products in the assortment. For example, the size of bubble 706 may grow larger when a substitutable product is removed. However, in response to the removal of the substitutable product, assortment planner 110 may remove one or more additional removals of products from the assortment (or additions of different products to the assortment) to further modify the assortment. These modifications may be based, at least in part, on the changing size and colors of the one or more bubbles. In response to a finalized product assortment, assortment purchase planner 210 initiates a supply chain process, as described above, to alter inventory at one or more supply chain entities in reflect the new product assortment.

Additionally, or in the alterative, embodiments of interactive two-dimensional visualization 700 having transferable demand links 802 provides an interface to change the values of one or more attributes associated with a product in the assortment. In response to a changed value in the interface, such as, for example, in response to a user assigning a new value to one or more attributes, the visualization module automatically displays the recalculated values. For example, if a change is made to the importance of the attributes, such as, brand importance, the visualization module automatically recalculates the impact on the similarity of the products in the assortment based, at least in part on, and in response to the changed importance value. As another example, if a product is added or removed, the visualization module recalculates and displays the effects of the product removal or addition on the assortment.

Reference in the foregoing specification to "one embodiment", "an embodiment", or "some embodiments" means that a particular feature, structure, or characteristic described in connection with the embodiment is included in at least one embodiment of the invention. The appearances of the phrase "in one embodiment" in various places in the specification are not necessarily all referring to the same embodiment.

While the exemplary embodiments have been shown and described, it will be understood that various changes and modifications to the foregoing embodiments may become apparent to those skilled in the art without departing from the spirit and scope of the present invention.

What is claimed is:

1. A computer-implemented method for planning a product assortment using an interactive visualization, comprising:

receiving, by the computer, product attribute values for two or more items of a product assortment in a supply chain network comprising one or more supply chain entities, wherein an inventory of the one or more supply chain entities is used to store at least one of the one or more items;

displaying, by the computer, two or more icons on an interactive visualization of a graphical user interface via computer display, wherein each of the two or more icons is associated with each item of the two or more items, the distance between each of the two or more icons indicating the similarity of the two or more items;

in response to a user selection of an icon of the two or more icons, connecting, by the computer, the icon of the two or more icons with one or more other icons of the two or more icons with transferable demand links, the transferable demand links identifying transferable demand;

identifying, by the computer, an item of the two or more items to be removed from the product assortment;

removing, by the computer, the item of the two or more items from the product assortment; and based, at least in part, on transferable demand links associated with the removed item, causing robotic machinery, by the computer, to transport items among the one or more supply chain entities to restock the inventory according to the current state of items in the supply chain network.

2. The computer-implemented method of claim 1, wherein each icon of the two or more icons graphically indicate uniqueness and past sales performance of the product associated with each icon.

3. The computer-implemented method of claim 2, further comprising:

in response to removing the item of the two or more items from the product assortment, recalculating transferable demand between at least two icons displayed on the interactive visualization.

4. The computer-implemented method of claim 3, wherein the two or more icons indicate one or more of not unique top performers, unique top performers, not unique bad performers, and unique bad performers.

5. The computer-implemented method of claim 4, wherein the interactive visualization comprises an interface providing for modification of at least one of the product attribute values for the two or more items in the supply chain network.

6. The computer-implemented method of claim 5, further comprising:
monitoring the attribute values of the two or more items; and
in response to detection of a modified value of the product attribute values, automatically recalculating similarity between at least two items in the product assortment.

7. The computer-implemented method of claim 6, wherein each icon comprises a bubble, wherein a size of the bubble indicates uniqueness and a color of the bubble indicates past sales performance.

8. A system of an interactive transferable demand visualization, comprising:
a computer comprising a computer display, a processor and a memory and configured to:
receive product attribute values for two or more items of a product assortment in a supply chain network comprising one or more supply chain entities, wherein an inventory of the one or more supply chain entities is used to store at least one of the one or more items;
display of the computer display, on an interactive visualization graphical user interface, two or more icons wherein each of the two or more icons is associated with each item of the two or more items, the distance between each of the two or more icons indicating the similarity of the two or more items;
in response to a user selection of an icon of the two or more icons, connect the icon of the two or more icons with one or more other icons of the two or more icons with transferable demand links, the transferable demand links identifying transferable demand;
identify an item of the two or more items to be removed from the product assortment; and
remove the item of the two or more items from the product assortment; and
robotic machinery that, based at least in part, on transferable demand links associated with the removed item, transport items among the one or more supply chain entities to restock the inventory according to the current state of items in the supply chain network.

9. The system of claim 8, wherein each icon of the two or more icons graphically indicates uniqueness and past sales performance of the product associated with each icon.

10. The system of claim 9, wherein the computer is further configured to:
in response to removing the item of the two or more items from the product assortment, recalculate transferable demand between at least two icons displayed on the interactive visualization.

11. The system of claim 10, wherein the two or more icons indicate one or more of not unique top performers, unique top performers, not unique bad performers, and unique bad performers.

12. The system of claim 11, wherein the interactive visualization comprises an interface providing for modification of at least one of the product attribute values for the two or more items in the supply chain network.

13. The system of claim 12, wherein the computer is further configured to:
monitor the attribute values of the two or more items; and
in response to detection of a modified value of the product attribute values, automatically recalculate similarity between at least two items in the product assortment.

14. The system of claim 13, wherein each icon comprises a bubble, wherein a size of the bubble indicates uniqueness and a color of the bubble indicates past sales performance.

15. A non-transitory computer-readable medium embodied with software, the software when executed by a computer provides interactive product assortment planning and visualization by causing the computer to perform the following steps:
receiving product attribute values for two or more items of a product assortment in a supply chain network comprising one or more supply chain entities, wherein an inventory of the one or more supply chain entities is used to store at least one of the one or more items;
displaying two or more icons on an interactive visualization graphical user interface via a computer display, wherein each of the two or more icons is associated with each item of the two or more items, the distance between each of the two or more icons indicating the similarity of the two or more items;
in response to a user selection of an icon of the two or more icons, connecting the icon of the two or more icons with one or more other icons of the two or more icons with transferable demand links, the transferable demand links identifying transferable demand;
identifying an item of the two or more items to be removed from the product assortment;
removing the item of the two or more items from the product assortment; and
based, at least in part, on transferable demand links associated with the removed item, causing robotic machinery to transport items among the one or more supply chain entities to restock the inventory according to the current state of items in the supply chain network.

16. The non-transitory computer-readable medium of claim 15, wherein each icon of the two or more icons graphically indicate uniqueness and past sales performance of the product associated with each icon.

17. The non-transitory computer-readable medium of claim 16, wherein the software when executed is further configured to:
in response to removing the item of the two or more items from the product assortment, recalculate transferable demand between at least two icons displayed on the interactive visualization.

18. The non-transitory computer-readable medium of claim 17, wherein the two or more icons indicate one or more of not unique top performers, unique top performers, not unique bad performers, and unique bad performers.

19. The non-transitory computer-readable medium of claim 18, wherein the interactive visualization comprises an interface providing for modification of at least one of the product attribute values for the two or more items in the supply chain network.

20. The non-transitory computer-readable medium of claim 19, wherein the software when executed is further configured to:
   monitor the attribute values of the two or more items; and
   in response to detection of a modified value of the product attribute values, automatically recalculate similarity between at least two items in the product assortment.

* * * * *